(12) United States Patent
Behtash et al.

(10) Patent No.: US 12,563,770 B2
(45) Date of Patent: Feb. 24, 2026

(54) SEMICONDUCTOR DEVICE TRENCH TERMINATION STRUCTURE

(71) Applicant: NEXPERIA B.V., Nijmegen (NL)

(72) Inventors: Reza Behtash, Nijmegen (NL);
Alexander Harke, Nijmegen (NL);
Christian Liguda, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 717 days.

(21) Appl. No.: 17/720,994

(22) Filed: Apr. 14, 2022

(65) Prior Publication Data

US 2022/0336656 A1 Oct. 20, 2022

(30) Foreign Application Priority Data

Apr. 14, 2021 (EP) ..................................... 21168358

(51) Int. Cl.
| | |
|---|---|
| *H10D 30/00* | (2025.01) |
| *H10D 30/66* | (2025.01) |
| *H10D 62/10* | (2025.01) |
| *H10D 62/17* | (2025.01) |
| *H10D 84/00* | (2025.01) |

(52) U.S. Cl.
CPC ......... *H10D 30/665* (2025.01); *H10D 30/668* (2025.01); *H10D 62/104* (2025.01); *H10D 62/393* (2025.01); *H10D 84/146* (2025.01)

(58) Field of Classification Search
CPC ............. H01L 29/7811; H01L 29/7813; H01L 29/7806; H10D 30/665; H10D 30/668; H10D 84/148
See application file for complete search history.

(56) References Cited

U.S. PATENT DOCUMENTS

2013/0140630 A1 6/2013 Chen
2013/0168765 A1 7/2013 Lin et al.
(Continued)

FOREIGN PATENT DOCUMENTS

WO 2015105573 A1 7/2015

OTHER PUBLICATIONS

Extended European Search Report for corresponding European application No. 21168358.6, 8 pages, dated Sep. 24, 2021.

*Primary Examiner* — Reema Patel
(74) *Attorney, Agent, or Firm* — Ruggiero McAllister & McMahon LLC

(57) ABSTRACT

A semiconductor device having a termination structure is provided that is useful for trench semiconductor devices, such as trench Schottky diodes. The device includes a termination structure having a primary termination trench including a first insulating layer arranged on a sidewall and bottom, and a first polysilicon region spaced apart from the sidewall and bottom by the first insulating layer; and a secondary termination trench arranged further away from the active region than the primary termination trench. The secondary termination trench includes a second insulating layer arranged on a sidewall and bottom, and polysilicon spacers separated from the sidewall and bottom by the second insulating layer. The polysilicon spacers are spaced apart and arranged on opposing ends of the secondary termination trench in an outward direction with respect to the active region, and a width of the primary termination trench is less than a width of the secondary termination trench.

20 Claims, 5 Drawing Sheets

(56)  References Cited

U.S. PATENT DOCUMENTS

| | | | |
|---|---|---|---|
| 2015/0200250 A1* | 7/2015 | Lin, I ................... | H10D 62/104 |
| | | | 257/481 |
| 2017/0023834 A1* | 1/2017 | Park ..................... | H10D 86/441 |
| 2020/0035792 A1* | 1/2020 | Kikuchi ................ | H10D 62/80 |
| 2023/0411402 A1* | 12/2023 | Kobayashi ............ | H10D 84/85 |

* cited by examiner

100

3/5

SEMICONDUCTOR DEVICE TRENCH TERMINATION STRUCTURE

CROSS REFERENCE TO RELATED APPLICATION

This application claims the benefit under 35 U.S.C. § 119(a) of European Application No. 21168358.6 filed Apr. 14, 2021, the contents of which are incorporated by reference herein in their entirety.

BACKGROUND OF THE DISCLOSURE

1. Field of the Disclosure

The present disclosure relates to a semiconductor device having a termination structure. More in particular, the present disclosure relates to a termination structure that is particularly useful for trench semiconductor devices, such as trench Schottky diodes.

2. Description of the Related Art

Semiconductor devices, such as transistors and diodes, may be subjected to relatively high voltages during operation. These semiconductor devices may be susceptible to breakdown events due to exceedingly high electric fields inside the semiconductor device due to said high voltages. In particular, breakdown can occur when a voltage applied to terminals of the semiconductor device exceeds a breakdown voltage of the device for an extended amount of time. During breakdown, the electric field may, at a position inside the device, exceed the critical electric field at that position. The value of the critical electric field depends on the material that is used. However, the resulting breakdown voltage of the device not only depends on the materials used but also on structural features of the semiconductor device. For example, metal electrodes having point like ends are more susceptible to result in premature electrical breakdown than electrodes having rounded or chamfered ends.

For some devices, the breakdown voltage can be increased through the use of trenches in the semiconductor body. This is illustrated in FIG. 1 in which a planar Schottky diode 1A is shown on the left, and a trench Schottky diode 1B on the right. Each diode 1A, 1B comprises a bottom electrode 2, an n+-doped silicon substrate 3, an n-doped silicon drift region 4, and a top electrode 5. Trench Schottky diode 1B additionally comprises a trench 7 of which a bottom and sidewall are covered by an insulating layer, such as an oxide 8. Inside trench 7, a polysilicon body 9 is arranged that is electrically isolated from drift region 4 by oxide 8.

FIG. 1 also schematically illustrates equipotential lines 6 during reverse operation. Regions in which the equipotential lines lie close together are regions in which the electric field is relatively high. As can be seen in FIG. 1, the equipotential lines in trench Schottky diode 1B are more regularly distributed. More in particular, the electric field in the semiconductor region below contact 5 is less than in planar Schottky diode 1A. It is noted that inside oxide 8, high electric fields may exist. However, the critical electric field inside oxide 8, e.g. approximately 10 MV per centimeter, is substantially higher than the critical electric field of silicon, e.g. approximately 0.3 MV per centimeter.

Typically, the semiconductor device comprises a plurality of unit cells that are regularly arranged. Within an inner region of this plurality of unit cells, the trenches are very effective in increasing the breakdown voltage. However, near the edges of the device symmetry is broken and the effectiveness of the trenches is reduced.

To address this problem, a termination structure can be included in the semiconductor device, in particular in semiconductor devices for high-voltage applications where breakdown can be a regular concern. The termination structure changes an electric field distribution inside the semiconductor device to thereby relieve critical regions of the semiconductor device at which breakdown typically occurs. In other words, the termination structure can be included to reduce electrical potential gradients in the semiconductor device similar to that shown in FIG. 1, especially at regions that are critical to the breakdown performance of the semiconductor device. Consequently, by including a termination structure in a semiconductor device, the breakdown voltage of the semiconductor device can be further improved.

A simplified top view of a semiconductor device 100 known in the art is shown in FIG. 2. In this figure, semiconductor device 100 is arranged in a semiconductor substrate having an active region 110 and a termination region 130 surrounding said active region 110.

In active region 110, one or more unit cells 120 of semiconductor device 100 can be arranged. Each unit cell 120 individually forms a portion of semiconductor device 100, and all unit cells 120 combined form an active part of semiconductor device 100. As shown in FIG. 2, unit cells 120 may for example be formed as parallel strips, or 'fingers', in active region 110. However, the shape of unit cells 120 is not limited thereto. Unit cells 120 may also be formed in other shapes, such as a circular or hexagonal shape. Furthermore, the shape of each unit cell 120 need not be identical.

In termination region 130, a termination structure 140 is provided to improve the breakdown voltage of semiconductor device 100 as explained above. Termination structure 140 in termination region 130 may, for example, laterally enclose unit cells 120 in active region 110.

A cross-sectional view of a section of semiconductor device 100 is shown in FIG. 3. The cross-sectional view of FIG. 3 may, for example, correspond to a cross-section along line segment a-a' as indicated in FIG. 2.

FIG. 3 illustrates an example where semiconductor device 100 is a trench Schottky diode. More in particular, in FIG. 3, a unit cell 120 near an edge of active region 110 is shown. Unit cell 120 comprises a trench 121 arranged inside a semiconductor body 101. An insulating layer 122 (e.g., an oxide material such as a thermal oxide) covers a sidewall and bottom of trench 121. In addition, a polysilicon region 123 is arranged inside trench 121, wherein polysilicon region 123 is separated from the sidewall and bottom of trench 121 by insulating layer 122.

Furthermore, a Schottky metal layer 103 is arranged on top of semiconductor body 101 and trench 121 of unit cell 120, thereby electrically contacting semiconductor body 101 as well as polysilicon region 123. Since Schottky metal layer 103 is contacting semiconductor body 101, a Schottky barrier is formed between said Schottky metal layer 103 and semiconductor body 101. It should be noted that semiconductor body 101 may have a similar configuration as trench Schottky diode 1B of FIG. 1.

A contact metal 104 is arranged covering Schottky metal 103 to provide an external electrical contact to a terminal of the trench Schottky diode. Although not shown in FIG. 3, a second contact can be provided at a bottom of semiconductor body 101 to provide an external electrical contact to another terminal of the trench Schottky diode.

In FIG. 3, a dashed line is shown to indicate a border between active region 110, in which unit cells 120 are arranged, and termination region 130, in which termination structure 140 is arranged. As shown in FIG. 3, termination structure 140 comprises a termination trench 141 having a greater width with respect to trench 121 of unit cell 120. An insulating layer 142 (e.g., an oxide material) covers a sidewall and bottom of termination trench 141. Furthermore, termination trench 141 comprises polysilicon spacers 143a and 143b that are not mutually connected but spaced apart and arranged at opposing ends inside termination trench 141, in a direction outward from active region 110. Polysilicon spacers 143a and 143b are spaced apart from a sidewall and bottom of termination trench 141 by insulating layer 142. Polysilicon spacers 143a and 143b are formed by residual polysilicon material resulting from a polysilicon etching step in the manufacturing process, as will be explained further below. Furthermore, insulating layer 142 and insulating layer 122 may be identical layers formed during the same processing step.

Termination structure 140 further comprises another insulating layer 102 that covers a part of insulating layer 142, polysilicon spacer 143b, and partially covers polysilicon spacer 143a. However, a portion of polysilicon spacer 143a is left exposed by insulating layer 102. Schottky metal 103 and contact metal 104 extend from active region 110 into termination region 130, thereby at least partially covering termination trench 141 and being electrically connected to a portion of polysilicon spacer 143a that is left exposed by insulating layer 102.

Termination structure 140 is used to avoid high electric fields that typically occur in corner regions of termination trench 141 and in a region of the insulating layers near ends of contact metal 104. By electrically connecting Schottky metal 103 and contact metal 104 to polysilicon spacer 143a, the effective contacted region is brought closer to the active region near the corner regions of termination trench 141 through polysilicon spacer 143a. Consequently, in reverse operation of semiconductor device 100 (e.g., the Schottky diode), said active region is more effectively depleted, which allows for a more favorable electric field distribution in the corner region of termination trench 141. Furthermore, insulating layer 102, which typically has a greater thickness than insulating layer 142, is used to accommodate a high electric field occurring in termination trench 141 near ends of contact metal 104.

In other words, by electrically contacting polysilicon 143a, it is ensured that the electric field inside semiconductor device at critical regions near the edges of the plurality of unit cells in semiconductor device 100 is eased, thereby improving the breakdown voltage of semiconductor device 100. Typically, insulating layer 102 has a greater thickness than insulating layer 142 to further isolate Schottky metal 103 and contact metal 104 from semiconductor body 101 inside trench 141.

A manufacturing process of semiconductor device 100 is as follows. First, an epitaxial layer is grown on a semiconductor substrate, the semiconductor substrate and epitaxial layer together forming semiconductor body 101. A trench mask is used to etch one or more trenches 121, corresponding to unit cells 120, and termination trench 141, corresponding to termination structure 140, into semiconductor body 101, e.g. in the epitaxial layer. Termination trench 141 is made substantially wider than trench(es) 121 of unit cell(s) 120 to improve the breakdown voltage performance of semiconductor device 100.

Following this, the aforementioned mask is removed, and an insulating layer, e.g. an oxide material, is thermally grown on semiconductor body 101, as well as on the sidewalls and bottom of trench(es) 121 and termination trench 141. On top of said insulating layer, a polysilicon material is deposited, implanted and diffused. Alternatively, a doped polysilicon material is deposited.

The polysilicon material is then etched back to form a polysilicon region 123 in trench 121 of unit cells 120. However, due to the relatively large width of termination trench 141 (e.g., with respect to trench(es) 121), the etch-back inside termination trench 141 will remove polysilicon only at the inner area of termination trench 141 and leave excess polysilicon material at its sidewalls. Consequently, after the etching step, trench(es) 121 will remain substantially filled with polysilicon material, thereby forming polysilicon region 123, while only polysilicon spacers 143a and 143b remain as 'residual' polysilicon material in termination trench 141. Then, an insulating layer 102, e.g., an oxide material, is deposited.

After depositing insulating layer 102, a contact mask is used to etch part of the deposited insulating layer in active region 110 to thereby expose semiconductor body 101 in between trenches 121 and in between trench 121 and trench 141. Furthermore, part of polysilicon spacer 143a is exposed. At this stage, the remaining parts of the thermally grown insulating layer respectively form insulating layer 122 in trench 121 and insulating layer 142 in termination trench 141.

The above process is continued with a deposition, lithography and etching of Schottky metal 103 and contact metal 104, thereby arriving at the device shown in FIG. 3. Although not shown in FIG. 3, the process may be complemented with providing a passivation layer covering semiconductor device 100.

A problem associated with the termination structure shown in FIG. 3 is that, in order to effectively improve the breakdown voltage of semiconductor device 100, polysilicon spacer 143a must be made sufficiently wide in order for contact metal 104 to reliably contact polysilicon spacer 143a. Here, sufficiently wide means that a substantial electric field in a region in between trench 121 and termination trench 141 is prevented during normal operation for preventing breakdown performance from being adversely affected. To achieve this, the width of polysilicon spacer 143a is approximately at least one fourth of the depth of the trench depth. Here, it is noted that the width of polysilicon spacer 143a obtained after etching back the polysilicon material strongly depends on the amount of deposited polysilicon material prior to the etching step. In other words, the amount of deposited polysilicon material dictates the eventual width of polysilicon spacers 143a and 143b. However, depositing large amounts of polysilicon material has high associated costs and is therefore not desirable, in particular when considering that a substantial part of said polysilicon material is wasted in the etching process.

Additionally, after the polysilicon etching step, polysilicon spacers 143a and 143b will have a slanted surface. As a result, a lithography step for Schottky metal layer 103 and contact metal layer 104 is significantly complicated due to the slanted surface and due to the relatively high resolution that is required. This may partially be alleviated by increasing the width of polysilicon spacer 143a. However, doing so would again require more polysilicon material to be deposited initially, thereby resulting in higher associated manufacturing costs.

As described above, the termination structure shown in FIG. 3 significantly complicates the manufacturing process of the semiconductor device. Therefore, there is a need for a termination structure design that can effectively improve the breakdown voltage of the semiconductor device while having a minimal impact on the complexity and costs associated with the manufacturing process thereof.

SUMMARY

It is an object of the present disclosure to provide a semiconductor device for which the abovementioned problems do not occur or hardly so.

This object is achieved by the semiconductor device according to claim 1. The semiconductor device according to the present disclosure comprises a semiconductor body comprising an active region and a termination region laterally surrounding the active region. The semiconductor device further comprises a plurality of semiconductor device unit cells arranged in the active region, and a termination structure arranged in the termination region. Each semiconductor device unit cell comprises a unit cell trench having a unit cell insulating layer arranged on a sidewall and bottom thereof, and a unit cell polysilicon region spaced apart from the sidewall and bottom by the unit cell insulating layer.

The termination structure comprises a primary termination trench comprising a first insulating layer arranged on a sidewall and bottom thereof, and a first polysilicon region spaced apart from said sidewall and bottom by said first insulating layer. The termination structure additionally comprises a secondary termination trench arranged further away from the active region than the primary termination trench, wherein the secondary termination trench comprises a second insulating layer arranged on a sidewall and bottom thereof, and polysilicon spacers separated from said sidewall and bottom by said second insulating layer, wherein the polysilicon spacers are spaced apart and arranged on opposing ends of the secondary termination trench in an outward direction with respect to the active region. A width of the primary termination trench is less than a width of the secondary termination trench.

The semiconductor device further comprises a third insulating layer arranged to partially cover the primary termination trench and to at least partially cover the secondary termination trench. The semiconductor device further comprises a metal layer covering and contacting the semiconductor body between the unit cell trenches and the unit cell polysilicon region in the active region, covering and contacting the semiconductor body between the primary termination trench and adjacent unit cell trenches, partially covering and contacting the first polysilicon region, and at least partially covering the third insulating layer.

By including the primary termination trench, the need for contacting the polysilicon spacer in the secondary termination trench is eliminated. The width of these polysilicon spacers is therefore no longer a critical parameter, thereby enabling a reduction in the amount of polysilicon material that is deposited and etched during the manufacturing process of the semiconductor device.

In addition, it is sufficient for the metal layer to electrically contact the first polysilicon region in the primary termination trench to achieve the desired termination effect. In other words, the metal layer is no longer required to be electrically connected to the polysilicon spacer, and more in particular its inherently slanted surface, thereby easing the lithography step during the manufacturing process of the semiconductor device.

The primary termination trench and the secondary termination trench may be spaced apart at a distance at which a substantial electric field in a region of the semiconductor body in between said primary termination trench and secondary termination trench is prevented during normal operation. The Applicant has found that such a configuration improves the breakdown voltage performance of the semiconductor device.

The semiconductor body may comprise a semiconductor substrate and an epitaxial layer on top of the semiconductor substrate, wherein the unit cells and the termination structure are arranged in the epitaxial layer of the semiconductor body.

A depth of the unit cell trenches may be substantially equal to a depth of the primary termination trench and/or the secondary termination trench. Additionally or alternatively, a width of the unit cell trenches can be equal to or less than a width of the primary termination trench.

The plurality of unit cells may each and jointly form a trench Schottky diode, wherein the metal layer comprises a Schottky metal layer. The metal layer may further comprise a contact metal layer arranged on top of said Schottky metal layer. Typically, the contact metal layer is much thicker than the Schottky metal layer, for example at least 5 times thicker.

The Schottky metal layer may comprise one of iron, molybdenum, nickel, platinum, titanium, tungsten and alloys thereof. The contact metal layer may comprise one of aluminium, copper, gold, nickel, silver, titanium, tungsten, vanadium, zinc and alloys thereof. The semiconductor body may comprise an n+-doped substrate and an n-doped drift region on the substrate, or the semiconductor body may comprise a p+-doped substrate and a p-doped drift region on the substrate. In both cases, the unit trenches extend solely in the drift region.

The first insulating layer and the second insulating layer may have a substantially identical thickness, and/or the third insulating layer may have a greater thickness than the first insulating layer and/or the second insulating layer. Furthermore, a thickness of the unit cell insulating layer can be substantially equal to the thickness of the first insulating layer and/or the second insulating layer.

The metal layer may fully cover the termination structure. Alternatively, the metal layer may fully cover the primary termination trench and partially cover the secondary termination trench.

The semiconductor device may further comprise one or more further primary termination trenches, wherein each further primary termination trench is either arranged in between the primary termination trench and the secondary termination trench or is arranged further away from the active region than the secondary termination trench. The one or more further primary termination trenches may each comprise a fourth insulating layer arranged on a sidewall and bottom thereof, and a third polysilicon region spaced apart from said sidewall and bottom by said fourth insulating layer. Each of the one or more further primary termination trenches can preferably be substantially identical to the primary termination trench.

The third insulating layer may be further arranged to fully cover the further primary termination trench. Alternatively, a portion of the third insulating layer above the further primary termination trench is omitted such that the metal layer electrically contacts the fourth polysilicon region.

BRIEF DESCRIPTION OF THE DRAWINGS

Next, the present disclosure will be described with reference to the appended drawings, wherein.

Hereinafter, reference will be made to the appended drawings. It should be noted that identical reference signs may be used to refer to identical or similar components.

DETAILED DESCRIPTION

Figure 4:
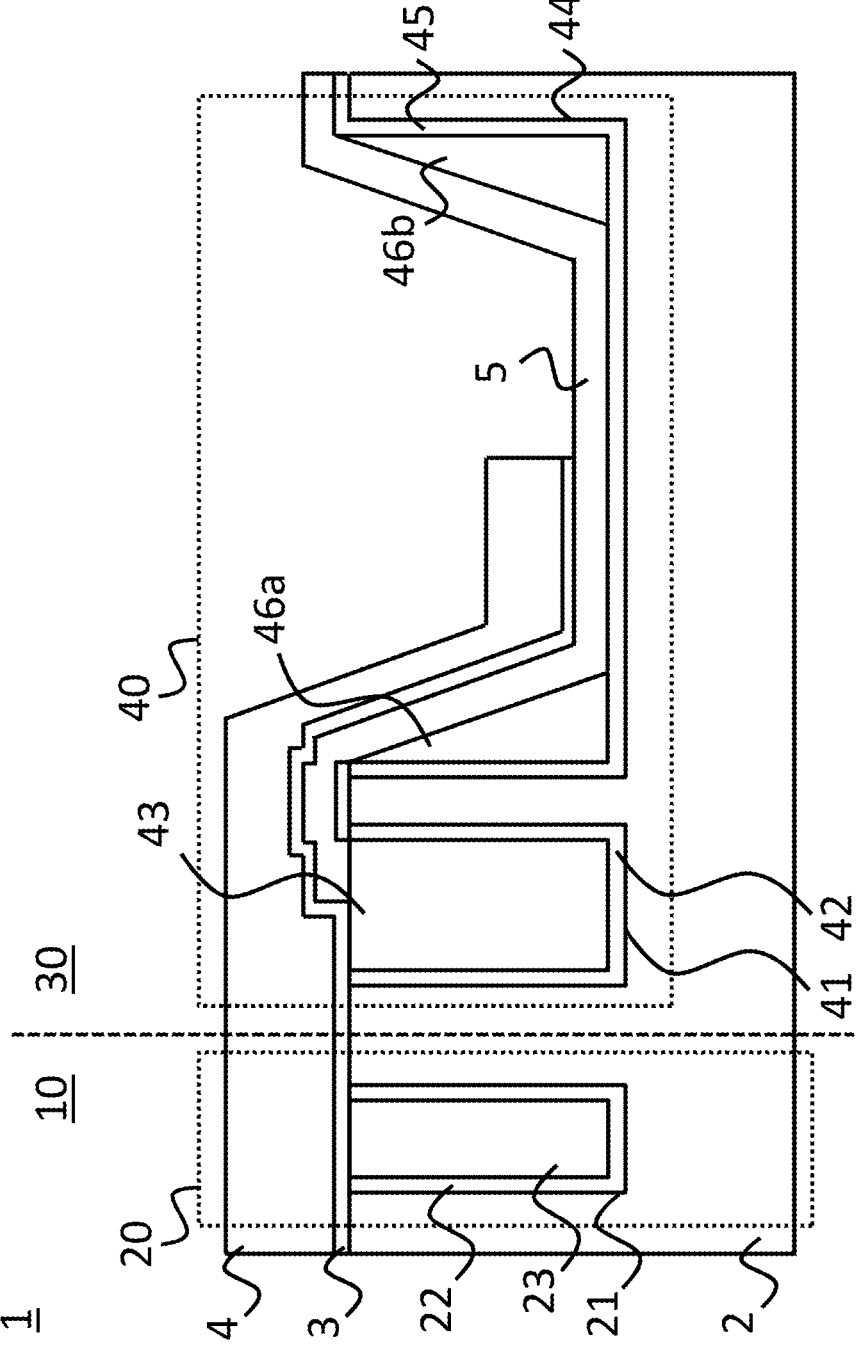
FIG. 4 is a cross-sectional view of part of a semiconductor device according to an embodiment of the present disclosure.

In FIG. 4, a part of a cross-sectional view of a semiconductor device 1 according to the present disclosure is shown. In the example shown in FIG. 4, semiconductor device 1 is a trench Schottky diode.

Figure 1:
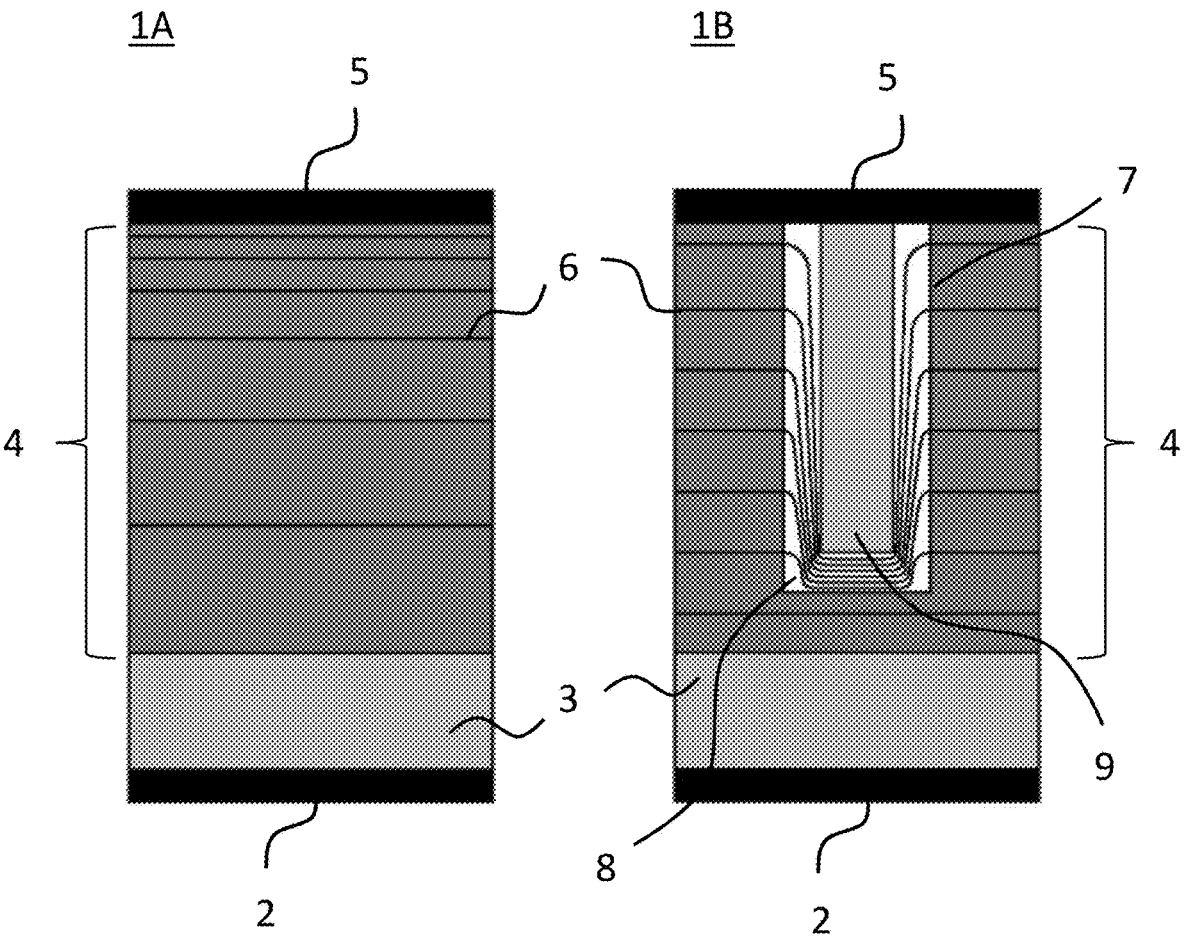
FIG. 1 is a comparison between a known planar Schottky diode and a known trench Schottky diode.
Figure 2:
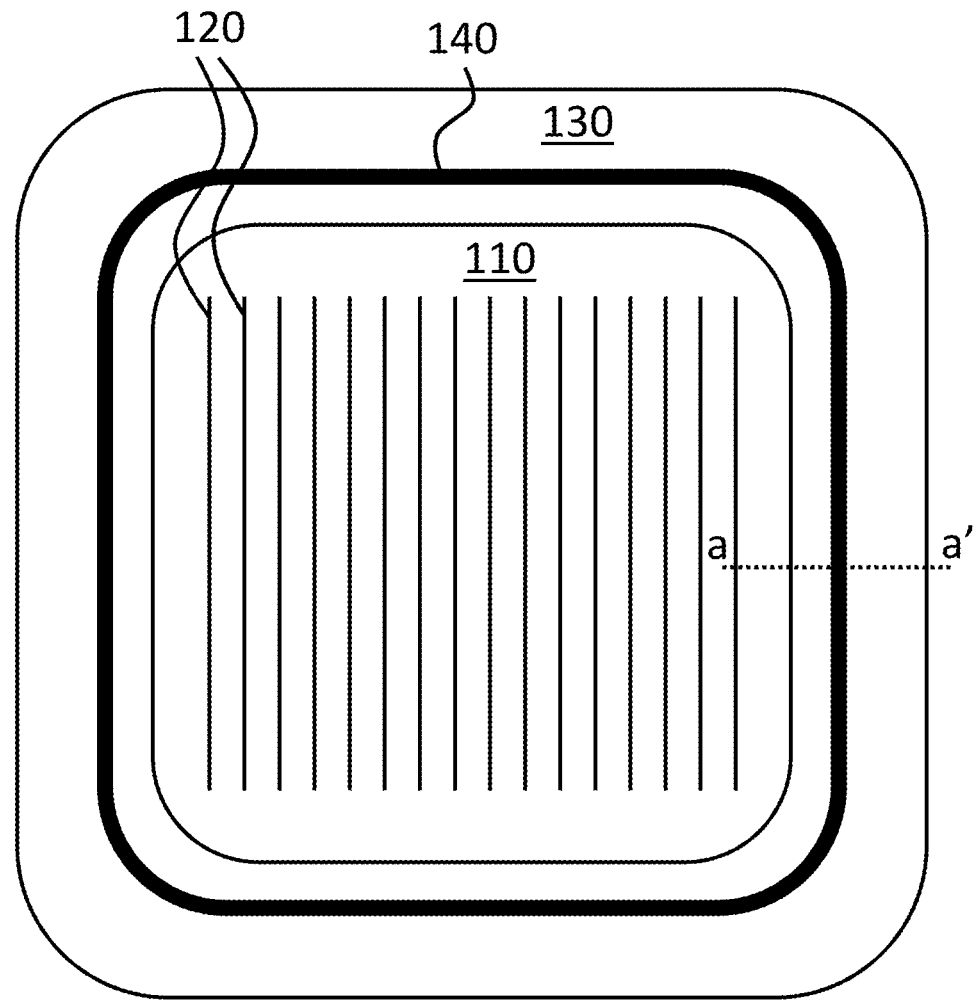
FIG. 2 is a simplified top view of a semiconductor device.

Here, it is noted that the simplified top view shown in FIG. 2 may also correspond to a top view of semiconductor device 1. Hence, the cross-sectional view shown in FIG. 4 may correspond to a cross-section taken along dotted line segment a-a' as indicated in the top view of FIG. 1.

Semiconductor device 1 comprises a semiconductor body 2. In FIG. 4, a dashed line is shown that indicates a border between an active region 10 and a termination region 30 of semiconductor device 1. A plurality of unit cells 20, which form an active part of semiconductor device 1, is arranged in active region 10. Only one unit cell 20 is shown in FIG. 4.

Each of the plurality of unit cells 20 comprises a unit cell trench 21 arranged in semiconductor body 2. A unit cell insulating layer 22 is arranged on a sidewall and bottom of unit cell trench 21, and a unit cell polysilicon region 23 is arranged in unit cell trench 21. More in particular, unit cell polysilicon region 23 is spaced apart from the sidewall and bottom of unit cell trench 21 by unit cell insulating layer 22. The plurality of unit cells 20 may be functionally and structurally identical to one another, and together form a combined semiconductor device.

Active region 10 is covered by a metal layer comprising a Schottky metal layer 3 and a contact metal layer 4 covering said Schottky metal layer 3. More in particular, the metal layer covers and contacts a top surface of semiconductor body 2 in between unit cell trenches 21. As a result, a Schottky barrier is formed between Schottky metal layer 3 and semiconductor body 2. Furthermore, the metal layer covers and is electrically connected to unit cell polysilicon region 23. Contact metal layer 4 provides an electrical contact of semiconductor device 1. Although not shown, another metal layer may be provided at a bottom surface of semiconductor body 2 to provide a further electrical contact to semiconductor device 1.

Due to the electrical connection of the metal layer to semiconductor body 2 as well as unit cell polysilicon region(s) 23, the plurality of unit cells 20 can each operate as a trench Schottky diode.

In termination region 30, which laterally surrounds active region 10, a termination structure 40 is arranged. Termination structure 40 comprises a primary termination trench 41 and a secondary termination trench 44, wherein primary termination trench 41 is arranged closer to active region 10 than secondary termination trench 44, and wherein a width of primary termination trench 41 is less than a width of secondary termination trench 44.

Primary termination trench 41 comprises a first insulating layer 42 arranged on a sidewall and bottom thereof, and a first polysilicon region 43 spaced apart from said sidewall and bottom by said first insulating layer 42. On the other hand, secondary termination trench 44 comprises a second insulating layer 45 arranged on a sidewall and bottom thereof, and polysilicon spacers 46a, 46b spaced apart from said sidewall and bottom by said second insulating layer 45.

The isotropically deposited polysilicon material thickness is small in relation to the width of secondary termination trench 44. As a consequence, after the polysilicon etching step, secondary termination trench 44 comprises residual polysilicon material in the form of polysilicon spacers 46a, 46b that are spaced apart and positioned on opposing sides thereof, while the polysilicon material inside primary termination trench 41, which forms first polysilicon region 43, constitutes a single contiguous region, similar to unit cell polysilicon region 23 in unit cell trench 21 of the plurality of unit cells 20.

Furthermore, contact metal layer 4 extends from active region 10 into termination region 30 and is electrically connected to first polysilicon region 43 of primary termination trench 41 in order to achieve the desired termination effect. Schottky metal layer 3 and contact metal layer 4 also cover and contact the upper surface of semiconductor body 2 between primary termination trench 41 and adjacent unit cell trench 21. More in particular, first insulating layer 42, unit cell insulating layer 22, and second insulating layer 45 may be formed during the same processing step and may therefore be considered as different parts of a primary oxide layer. At the upper surface of semiconductor body 2 between primary termination trench 41 and adjacent unit cell trench 21, this primary oxide layer is removed before depositing the Schottky metal layer 3.

Figure 3:
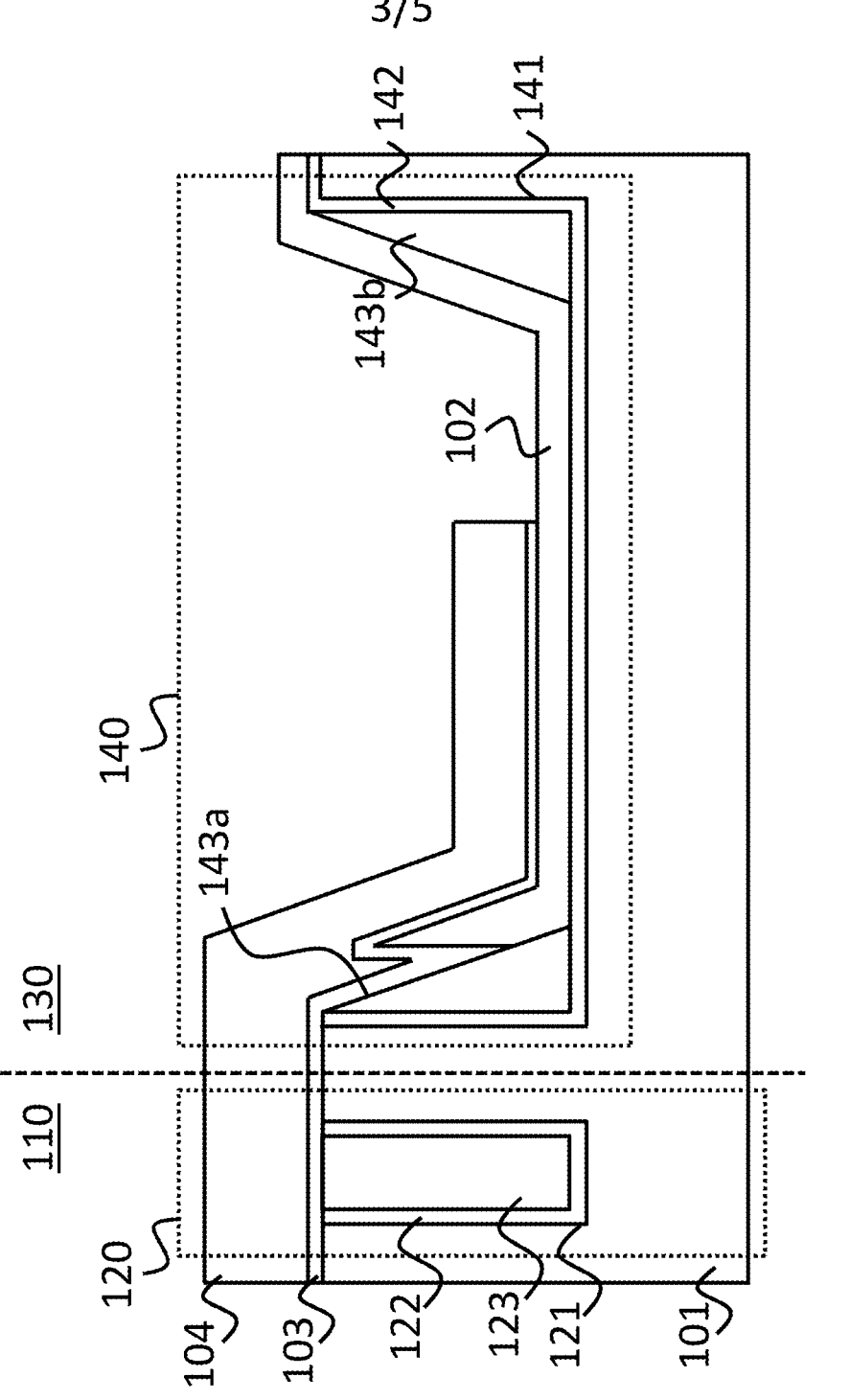
FIG. 3 is a cross-sectional view of part of a semiconductor device known in the art.

Since the metal layer is no longer required to contact polysilicon spacer 46a, said polysilicon spacer 46a can be left at a floating potential. This enables depositing and etching less polysilicon material during the manufacturing process, since the width of polysilicon spacer 46a is no longer relevant. Additionally, a lithography step need not be performed on a slanted surface and does not require the same resolution as the lithography of the semiconductor device of FIG. 3.

Semiconductor device 1 further comprises a third insulating layer 5 that partially covers primary termination trench 41 and that at least partially covers secondary termination trench 44 and extend above a part of the abovementioned primary oxide. This insulating layer 5 may be formed using deposition. In FIG. 4, third insulating layer 5 extends partially across the width of secondary termination trench 44. However, other embodiments in which third insulating layer 5 extends across the entire width of secondary termination trench 44 are also envisaged. Third insulating layer 5 provides further isolation of the metal layer from semiconductor body 2 outside of active region 10, and may have a greater thickness than first insulating layer 42 and second insulating layer 44.

In FIG. 4, the metal layer, i.e., Schottky metal layer 3 and contact metal layer 4, extends partially across secondary termination trench 44. However, the present disclosure is not limited thereto. The metal layer could also cover the entire width of secondary termination trench 44.

A depth of primary termination trench 41 may be identical to a depth of secondary termination trench 44. Furthermore, a depth of unit cell trench 21 of unit cell 20 may also be identical to the depth of primary termination trench 41 and/or secondary termination trench 44.

In order to achieve an improved breakdown voltage performance, primary termination trench 41 and secondary termination trench 44 are preferably spaced apart by a specific distance range. More in particular, a distance between primary termination trench 41 and secondary termination trench 44 may be such that, in operation, a substantial electric field within the region between primary termination trench 41 and secondary termination trench 44 is prevented or limited under normal operating conditions.

Figure 5:
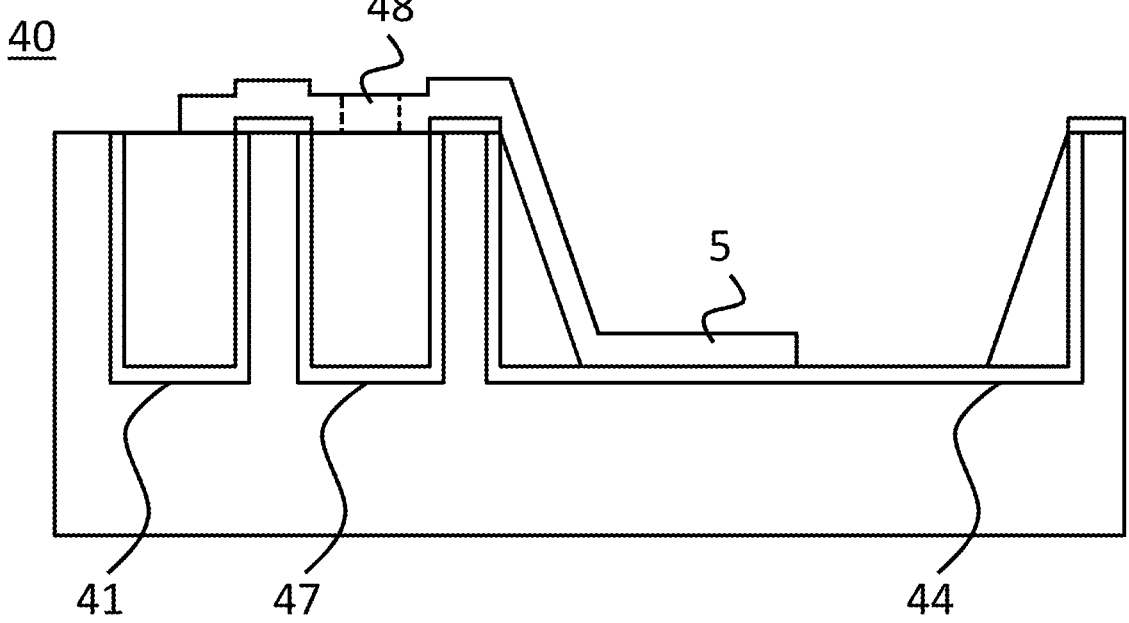
FIG. 5 is a cross-sectional view of a termination structure according to another embodiment of the present disclosure.

In FIG. 5, a cross-sectional view of an exemplary termination structure 40 according to another embodiment of the present disclosure is shown. For convenience, Schottky metal layer 3 and contact metal layer 4 are omitted from FIG. 5.

FIG. 5 shows a termination structure 40 comprising primary termination trench 41, secondary termination trench 44 and additionally comprising a further primary termination trench 47 arranged in between said primary and secondary termination trench 41, 44. Further primary termination trench 47 comprises a fourth insulating layer arranged on a sidewall and bottom thereof, and a third polysilicon region spaced apart from said sidewall and bottom by said fourth insulating layer.

Further primary termination trench 47 may have similar or identical dimensions with respect to primary termination trench 41. However, the present disclosure is not limited thereto. Further primary termination trench 47 may also be wider or narrower than primary termination trench 41.

Although further primary termination trench 47 is shown as being positioned in between primary and secondary termination trench 41, 44 in FIG. 5, it may also be arranged further away from active area 10 with respect to secondary termination trench 44.

Furthermore, in some embodiments, termination structure may comprise a plurality of further primary termination trenches 47. Each further primary termination trench 47 may be arranged in between primary and secondary termination trench 41, 44 and/or may be arranged further away from active area 10 with respect to secondary termination trench 44. As shown in FIG. 5, insulating layer 5 covers the entire width of further primary termination trench 47. However, this need not be the case. In some embodiments, a portion of third insulating layer 5 may be omitted, for example by forming a through hole 48, such that Schottky metal layer 3 can electrically contact the fourth polysilicon region of further primary termination trench 47.

Next, a method of manufacturing semiconductor device 1 will be explained. First, an epitaxial layer is grown on a semiconductor substrate, the semiconductor substrate and epitaxial layer together forming semiconductor body 2. For example, semiconductor body 2 could be a silicon body. A trench mask is used to etch a plurality of unit cell trenches 21, corresponding to unit cells 20, and to etch a primary termination trench 41 and a secondary termination trench 44, corresponding to termination structure 40, into semiconductor body 2, e.g. in the epitaxial layer. If applicable, further primary trench 47 may be formed as well during this step.

Following this, the aforementioned mask is removed, and an insulating layer, e.g. an oxide material, is thermally grown on semiconductor body 2, as well as on the sidewalls and bottom of trenches 21, 41, 44 and, if applicable, further primary trench 47. On top of said insulating layer, a polysilicon material is deposited, implanted and diffused.

The polysilicon material is then etched back to form a unit cell polysilicon region 23 in trench 21 of unit cells 20 and, if applicable, the third polysilicon region in further primary trench 47. However, the isotropically deposited polysilicon material thickness is small in relation to the width of secondary termination trench 44. Consequently, after the etching step, trenches 21, 41 will remain substantially filled with polysilicon material, thereby forming unit cell polysilicon region 23, and first polysilicon region 43, while only polysilicon spacers 46a and 46b remain as 'residual' polysilicon material in secondary termination trench 41.

After etching back the polysilicon material, the thermal oxide layer corresponding to layers 22, 42, and 44, will be etched inside the active region to expose the upper surface of semiconductor 2 between adjacent unit cell trenches 21. Simultaneously, the upper surface of semiconductor body 2 between primary termination trench 41 and adjacent unit cell trench 21 will be exposed, whereas the remaining upper surface of semiconductor body 2 inside termination region 30 will not be exposed.

Then, an oxide layer 5 is deposited. A contact mask and subsequent etch is then used to etch part of deposited oxide layer 5. As a result, oxide layer 5 completely covers the secondary termination trench 44 and the primary oxide in between primary termination trench 41 and secondary termination trench 44. Oxide layer 5 partially covers primary termination trench 41 but does not cover the active region 20.

The above process is continued with a deposition, lithography and etching of Schottky metal 3 and contact metal 4, thereby arriving at the device shown in FIG. 4. Although not shown in FIG. 4, the process may be complemented with providing a passivation layer covering semiconductor device 1.

In the above, the present disclosure has been explained using detailed embodiments thereof. However, it should be appreciated that the disclosure is not limited to these embodiments and that various modifications are possible without deviating from the scope of the present disclosure as defined by the appended claims.

What is claimed is:

1. A semiconductor device, comprising:
    a semiconductor body comprising an active region and a termination region laterally surrounding the active region;
    a plurality of semiconductor device unit cells arranged in the active region; wherein each semiconductor device unit cell comprises a unit cell trench having a unit cell insulating layer arranged on a sidewall and a bottom thereof, and a unit cell polysilicon region spaced apart from the sidewall and the bottom by the unit cell insulating layer;
    a termination structure arranged in the termination region, wherein the termination structure comprises:
        a primary termination trench comprising a first insulating layer arranged on a sidewall and a bottom thereof, and a first polysilicon region spaced apart from the sidewall and the bottom by the first insulating layer; and
        a secondary termination trench arranged further away from the active region than the primary termination trench, wherein the secondary termination trench comprises a second insulating layer arranged on a sidewall and bottom thereof, and polysilicon spacers separated from the sidewall and the bottom by the second insulating layer, and wherein the polysilicon spacers are spaced apart and arranged on opposing ends of the secondary termination trench in an outward direction with respect to the active region;

a third insulating layer arranged to partially cover the primary termination trench and at least partially cover the secondary termination trench; and a metal layer covering and contacting the semiconductor body between the plurality of unit cell trenches in the active region, covering and contacting the semiconductor body between the primary termination trench and adjacent unit cell trenches, partially covering and contacting the first polysilicon region, and at least partially covering the third insulating layer;

one or more further primary termination trenches, wherein the one or more further primary termination trenches each comprise a fourth insulating layer arranged on a sidewall and a bottom thereof, and a third polysilicon region spaced apart from the sidewall and the bottom by the fourth insulating layer; and wherein the third insulating layer is further arranged to cover the one or more further primary termination trenches; and wherein the primary termination trench has a width that is less than a width of the secondary termination trench.

2. The semiconductor device according to claim 1, wherein the primary termination trench and the secondary termination trench are spaced apart at a distance at which an electric field in a region of the semiconductor body in between the primary termination trench and the secondary termination trench is prevented during operation for preventing breakdown performance from being adversely affected.

3. The semiconductor device according to claim 1, wherein the semiconductor body comprises a semiconductor substrate and an epitaxial layer on top of the semiconductor substrate; and wherein the plurality of unit cells and the termination structure are arranged in the epitaxial layer of the semiconductor body.

4. The semiconductor device according to claim 1, wherein the unit cell trenches have a depth that is equal to a depth of the primary termination trench and/or the secondary termination trench.

5. The semiconductor device according to claim 1, wherein the unit cell trenches have a width that is less than a width of the primary termination trench.

6. The semiconductor device according to claim 1, wherein the plurality of unit cells each form a Schottky diode; and wherein the metal layer comprises a Schottky metal layer.

7. The semiconductor device according to claim 1, wherein the first insulating layer and the second insulating layer have a same thickness, and/or wherein the third insulating layer has a greater thickness than the first insulating layer and/or the second insulating layer.

8. The semiconductor device according to claim 1, wherein the metal layer fully covers the termination structure; or wherein the metal layer fully covers the primary termination trench and partially covers the secondary termination trench.

9. The semiconductor device according to claim 1, wherein each of the one or more further primary termination trenches is either arranged in between the primary termination trench and the secondary termination trench or is arranged further away from the active region than the secondary termination trench; and wherein the one or more further primary termination trenches each comprise a fourth insulating layer arranged on a sidewall and a bottom thereof, and a third polysilicon region spaced apart from the sidewall and the bottom by the fourth insulating layer.

10. The semiconductor device according to claim 2, wherein the semiconductor body comprises a semiconductor substrate and an epitaxial layer on top of the semiconductor substrate; and wherein the plurality of unit cells and the termination structure are arranged in the epitaxial layer of the semiconductor body.

11. The semiconductor device according to claim 6, wherein the metal layer further comprises a contact metal layer arranged on top of the Schottky metal layer.

12. The semiconductor device according to claim 11, wherein the Schottky metal layer comprises at least one metal selected from the group consisting of: iron, molybdenum, nickel, platinum, titanium, tungsten and alloys thereof; and/or wherein the contact metal layer comprises at least one metal selected from the group consisting of: aluminum, copper, gold, nickel, silver, titanium, tungsten, vanadium, zinc and alloys thereof.

13. The semiconductor device according to claim 6, wherein the semiconductor body comprises an n+-doped substrate and an n-doped drift region on the substrate, or wherein the semiconductor body comprises a p+-doped substrate and a p-doped drift region on the substrate; and wherein the plurality of unit cell trenches extend solely in the p-doped drift region.

14. The semiconductor device according to claim 7, wherein the unit cell insulating layer has a thickness that is equal to the thickness of the first insulating layer and/or the second insulating layer.

15. The semiconductor device according to claim 9, wherein each of the one or more further primary termination trenches is identical to the primary termination trench.

16. The semiconductor device according to claim 9, wherein the third insulating layer is further arranged to fully cover the further primary termination trench; or wherein the third insulating layer has a portion that is above the further primary termination trench is omitted so that the metal layer electrically contacts the third polysilicon region.

17. The semiconductor device according to claim 11, wherein the Schottky metal layer comprises at least one metal selected from the group consisting of: iron, molybdenum, nickel, platinum, titanium, tungsten and alloys thereof; and/or wherein the contact metal layer comprises at least one metal selected from the group consisting of: aluminum, copper, gold, nickel, silver, titanium, tungsten, vanadium, zinc and alloys thereof.

18. The semiconductor device according to claim 11, wherein the semiconductor body comprises an n+-doped substrate and an n-doped drift region on the substrate, or wherein the semiconductor body comprises a p+-doped substrate and a p-doped drift region on the substrate; and wherein the unit cell trenches extend solely in the p-doped drift region.

19. The semiconductor device according to claim 12, wherein the semiconductor body comprises an n+-doped substrate and an n-doped drift region on the substrate, or wherein the semiconductor body comprises a p+-doped substrate and a p-doped drift region on the substrate; and wherein the unit cell trenches extend solely in the drift region.

20. The semiconductor device according to claim 15, wherein the third insulating layer is further arranged to fully cover the further primary termination trench; or wherein the third insulating layer has a portion that is above the further primary termination trench is omitted so that the metal layer electrically contacts the third polysilicon region.

* * * * *